(12) United States Patent
Lee et al.

(10) Patent No.: US 12,332,693 B2
(45) Date of Patent: Jun. 17, 2025

(54) DISPLAY DEVICE

(71) Applicant: Samsung Display Co., LTD., Yongin-si (KR)

(72) Inventors: Chan Song Lee, Suwon-si (KR); Eun Kyung Park, Seoul (KR); You Gyoung Lee, Changwon-si (KR); Ji Hwa Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 106 days.

(21) Appl. No.: 17/082,939

(22) Filed: Oct. 28, 2020

(65) Prior Publication Data

US 2021/0255670 A1 Aug. 19, 2021

(30) Foreign Application Priority Data

Feb. 14, 2020 (KR) .................. 10-2020-0018532
Apr. 17, 2020 (KR) .................. 10-2020-0046850

(51) Int. Cl.
| | |
|---|---|
| *G06F 1/16* | (2006.01) |
| *B32B 7/12* | (2006.01) |
| *B32B 17/06* | (2006.01) |
| *G02B 1/14* | (2015.01) |
| *G09F 9/30* | (2006.01) |

(52) U.S. Cl.
CPC .............. *G06F 1/1652* (2013.01); *B32B 7/12* (2013.01); *B32B 17/06* (2013.01); *G02B 1/14* (2015.01); *G06F 1/1609* (2013.01); *G09F 9/301* (2013.01); *B32B 2307/51* (2013.01); *B32B 2307/548* (2013.01); *B32B 2457/20* (2013.01)

(58) Field of Classification Search
None
See application file for complete search history.

(56) References Cited

U.S. PATENT DOCUMENTS

| 10,569,505 B2 | 2/2020 | Katami et al. |
| 10,732,445 B2 | 8/2020 | Shin et al. |
| 11,775,121 B2 | 10/2023 | Shin et al. |
| 2015/0187845 A1 | 7/2015 | Kim |
| 2015/0266272 A1 | 9/2015 | Lee et al. |

(Continued)

FOREIGN PATENT DOCUMENTS

| KR | 1020150108991 A | 10/2015 |
| KR | 101645066 B1 | 8/2016 |

(Continued)

OTHER PUBLICATIONS

Armin Plichta, et al., "Flexible Glass Substrates", John Wiley & Sons, Ltd., (2005), pp. 35-55.

(Continued)

*Primary Examiner* — Anthony J Frost
(74) *Attorney, Agent, or Firm* — CANTOR COLBURN LLP

(57) ABSTRACT

A display device includes a display panel, and a front stacked structure on a front surface of the display panel, where the front stacked structure includes a cover window and a bonding member, the bonding member includes a window bonding member attached to the cover window, the cover window includes ultra-thin glass, and the window bonding member includes a silane compound containing an epoxy series reactive functional group.

20 Claims, 8 Drawing Sheets

(56) References Cited

U.S. PATENT DOCUMENTS

| | | | |
|---|---|---|---|
| 2016/0002103 A1* | 1/2016 | Wang | B23K 26/0624 |
| | | | 428/141 |
| 2016/0130478 A1* | 5/2016 | Nagata | C09J 143/02 |
| | | | 428/335 |
| 2016/0185083 A1 | 6/2016 | Yasui et al. | |
| 2017/0152413 A1* | 6/2017 | Choi | G02B 5/3033 |
| 2017/0200915 A1* | 7/2017 | Lee | G02B 5/3033 |
| 2017/0247579 A1 | 8/2017 | Kwak et al. | |
| 2018/0244953 A1* | 8/2018 | Woo | B32B 27/36 |
| 2018/0251400 A1* | 9/2018 | Bookbinder | C03C 3/097 |
| 2019/0086709 A1 | 3/2019 | Lee et al. | |
| 2019/0165311 A1* | 5/2019 | Lee | C08G 18/3206 |
| 2020/0068725 A1* | 2/2020 | Park | H05K 5/0017 |
| 2021/0027667 A1 | 1/2021 | Lee et al. | |

FOREIGN PATENT DOCUMENTS

| | | | |
|---|---|---|---|
| KR | 1020170007826 | A | 1/2017 |
| KR | 1020170122834 | | 11/2017 |
| KR | 1020180012966 | A | 2/2018 |
| KR | 1020180074544 | A | 7/2018 |
| KR | 1020190038725 | A | 4/2019 |
| KR | 102024251 | B1 | 9/2019 |
| KR | 102036551 | B1 | 10/2019 |
| KR | 1020210011552 | | 2/2021 |

OTHER PUBLICATIONS

Extended European Search Report—European Application No. EP21156265.7 dated Jul. 5, 2021, citing references listed within.

* cited by examiner

DISPLAY DEVICE

This application claims priority to Korean Patent Application Nos. 10-2020-0018532 filed on Feb. 14, 2020, and 10-2020-0046850 filed on Apr. 17, 2020, and all the benefits accruing therefrom under 35 U.S.C. 119, the contents of which in their entirety are herein incorporated by reference.

BACKGROUND

1. Field

The disclosure relates to a display device.

2. Description of the Related Art

Electronic apparatuses providing images to users, such as a smartphone, a tablet personal computer ("PC"), a digital camera, a laptop computer, a navigation device and a smart television, typically include a display device for displaying images.

Recently, a foldable display device has attracted much attention. Since the foldable display device has a wide screen with improved portability, the foldable display device may have various desired features of both of a smartphone and a tablet PC.

SUMMARY

A folding operation of a foldable display device may apply stress to each layer constituting the display device. When an adhesive layer provided for bonding a stacked structure is exposed to the stress, defective film removal may occur.

Embodiments of the disclosure provide a display device including a bonding member capable of preventing defective film removal even when folding operations are repeatedly performed.

According to embodiments of a display device, a bonding member includes a silane coupling agent, such that defective film removal may be effectively prevented at a high temperature and high humidity, thereby improving reliability.

According to an embodiment of invention, the display device includes a display panel, and a front stacked structure on a front surface of the display panel, where the front stacked structure includes a cover window and a bonding member, the bonding member includes a window bonding member attached to the cover window, the cover window includes ultra-thin glass, and the window bonding member includes a silane compound containing an epoxy series reactive functional group.

In an embodiment, an elastic modulus of the window bonding member may be in a range from about 0.07 megapascal (MPa) to about 0.3 MPa at a temperature of about −20° C., and may be in a range about 0.02 MPa to about 0.06 MPa at a temperature of about 60° C.

In an embodiment, a creep property of the window bonding member may be in a range from about 10% to about 25% at a temperature of about 60° C.

In an embodiment, the window bonding member may be a thin film and have a thickness in a range of about 25 micrometers (μm) to about 100 μm, and the elastic modulus and the creep property of the window bonding member may be obtained by measurement in a state of the thin film.

In an embodiment, the elastic modulus and the creep property of the window bonding member may be obtained by measurement using a rheometer in the state of the thin film.

In an embodiment, the window bonding member may have a peeling force of about 500 gram-force per inch (gf/inch) or more when peeling occurs at a peeling angle of about 180° with a peeling rate of about 300 millimeters per minute (mm/min) in a state of being attached to the ultra-thin glass.

In an embodiment, the ultra-thin glass may have a thickness in a range of about 10 micrometers (μm) to about 100 μm, and the window bonding member may have a peeling force of about 500 gf/inch or more when peeling occurs at a peeling angle of about 180° with a peeling rate of about 300 mm/min in a state of being attached to the ultra-thin glass.

In an embodiment, a glass transition temperature (Tg) of the window bonding member may be about −30° C. or less.

In an embodiment, the window bonding member may have a thickness in a range of about 25 μm to about 100 μm.

In an embodiment, the front stacked structure may further include a polarization member disposed between the display panel and the cover window and a polarization member bonding member which attaches the polarization member to the front surface of the display panel, and a peeling force of the window bonding member may be greater than a peeling force of the polarization member bonding member.

In an embodiment, the front stacked structure may further include an impact absorbing layer disposed between the polarization member and the cover window and an impact absorbing layer bonding member which attaches the impact absorbing layer to the polarization member, and a peeling force of the window bonding member may be greater than a peeling force of the impact absorbing layer bonding member.

In an embodiment, the display device may further include a rear stacked structure on a rear surface of the display panel, where the rear stacked structure may include a polymer film layer disposed on the rear surface of the display panel, a cushion layer disposed on the polymer film layer, a plate disposed on the cushion layer, and a heat dissipation member disposed on the plate.

In an embodiment, the bonding member may further include other bonding members attached to the polymer film layer, the cushion layer, the plate, and the heat dissipation member, respectively, and a peeling force of the window bonding member may be greater than a peeling force of the other bonding members.

In an embodiment, the display panel may display an image through a screen defined on the front surface thereof.

In an embodiment, a content of the silane compound may be about 0.2 parts by weight or less with respect to 100 parts by weight of the total composition of the window bonding member.

According to an embodiment of the invention, the display device includes a display panel, a front stacked structure on a front surface of the display panel, where the front stacked structure includes a cover window, and a rear stacked structure on a rear surface of the display panel, where each of the front stacked structure and the rear stacked structure includes a plurality of bonding members, the front stacked structure includes a window bonding member attached to the cover window among the plurality of bonding members, the cover window includes ultra-thin glass, the window bonding member includes a silane compound containing an epoxy series reactive functional group, and a peeling force of the window bonding member is greater than a peeling force of another bonding member of the plurality of bonding members.

In an embodiment, a content of the silane compound may be about 0.2 parts by weight or less with respect to 100 parts by weight of the total composition of the window bonding member.

In an embodiment, the window bonding member may have a peeling force of about 500 gf/inch or more when peeling occurs at a peeling angle of 180° with a peeling rate of 300 mm/min in a state of being attached to the ultra-thin glass.

In an embodiment, an elastic modulus of the window bonding member may be in a range from about 0.07 MPa to about 0.3 MPa at a temperature of about −20° C., and may be in a range about 0.02 MPa to about 0.06 MPa at a temperature of about 60° C.

In an embodiment, a creep property of the window bonding member may be in a range from about 10% to about 25% at a temperature of about 60° C.

In an embodiment, the front stacked structure may further include a polarization member disposed between the display panel and the cover window, and an impact absorbing layer disposed between the polarization member and the cover window, the rear stacked structure may further include a heat dissipation member disposed on the rear surface of the display panel, a plate disposed between the display panel and the heat dissipation member, a cushion layer disposed between the display panel and the plate, and a polymer film layer disposed between the display panel and the cushion layer, and the plurality of bonding members may be attached to the polarization member, the impact absorbing layer, the heat dissipation member, the plate, the cushion layer, and the polymer film layer, respectively.

In an embodiment, the display device may be an in-foldable display device which is folded such that a display surface faces inward or an out-foldable display device which is folded such that the display surface faces outward.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
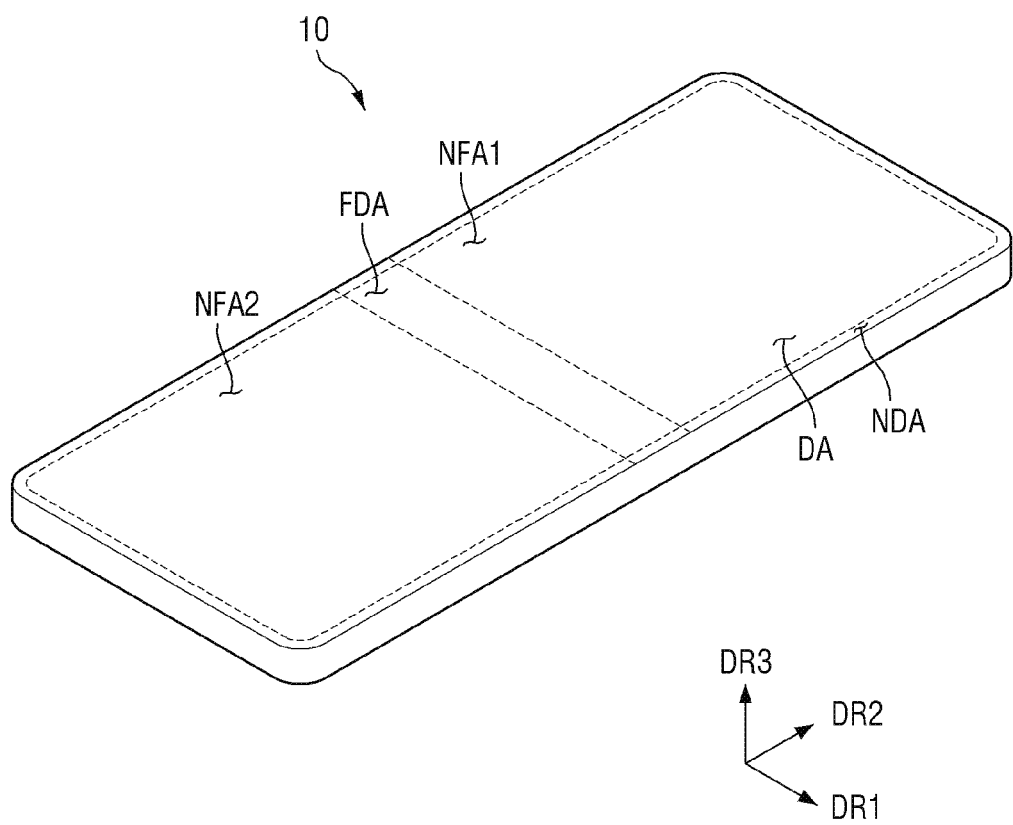
FIG. 1 is a perspective view illustrating a display device in an unfolded state according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the disclosure will be described in detail with reference to the accompanying drawings.

Figure 2:
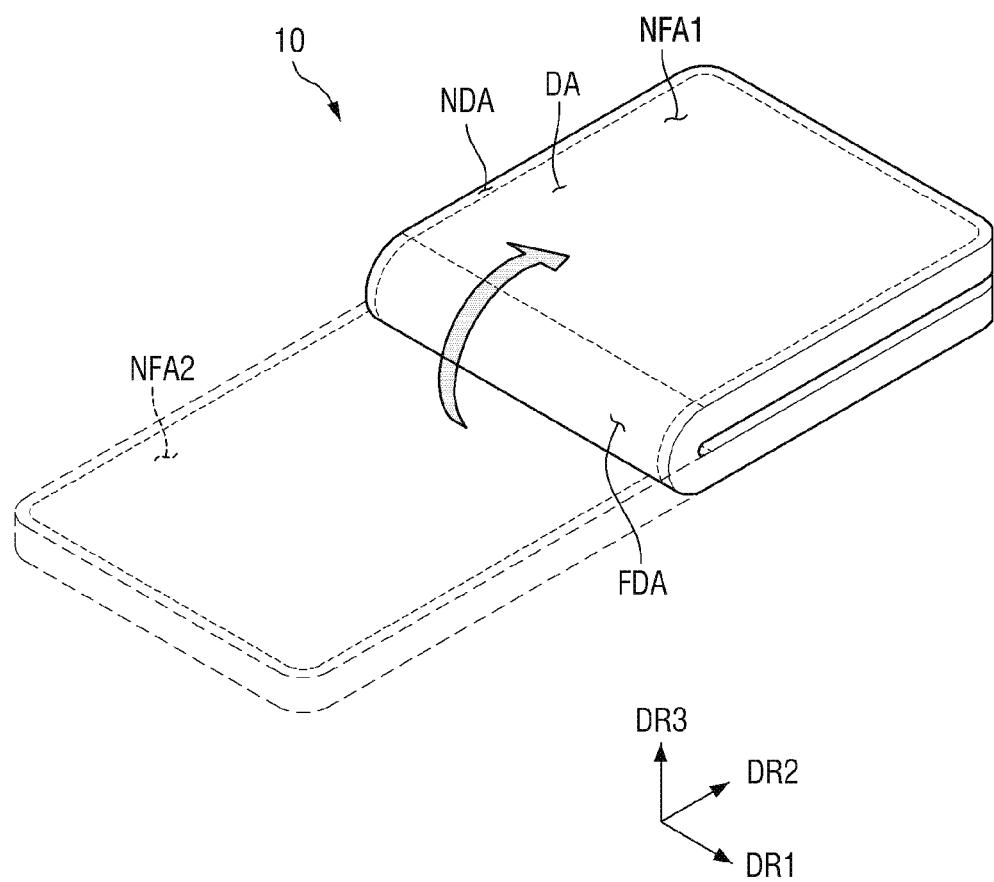
FIG. 2 is a perspective view illustrating a display device in a folded state according to an embodiment.

FIG. 1 is a perspective view illustrating a display device in an unfolded state according to an embodiment. FIG. 2 is a perspective view illustrating a display device in a folded state according to an embodiment.

Referring to FIG. 1, an embodiment of a display device 10 may be a foldable display device. In an embodiment, the display device 10 may be a smartphone, but is not limited thereto. In an alternative embodiment, the display device 10 may be a smartphone, a mobile phone, a tablet PC, a personal digital assistant ("PDA"), a portable multimedia player ("PMP"), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, or an Internet-of-Things device, for example.

In FIGS. 1 and 2, a first direction DR1 may be a direction parallel to one side of the display device 10 in a plan view and may be, for example, a horizontal (or width) direction of the display device 10. A second direction DR2 may be a direction parallel to the other side in contact with the one side of the display device 10 in a plan view and may be, for example, a vertical (or length) direction of the display device 10. A third direction DR3 may be a thickness direction of the display device 10.

In one embodiment, for example, the display device 10 may have a rectangular shape in a plan view. The display device 10 may have a rectangular shape with right-angled or rounded corners in a plan view. The display device 10 may include two short sides in the first direction DR1 and two long sides in the second direction DR2 in a plan view.

The display device 10 includes a display area DA and a non-display area NDA. In a plan view, the shape of the display area DA may correspond to the shape of the display device 10. In one embodiment, for example, where the display device 10 has a rectangular shape in a plan view, the display area DA may also have a rectangular shape.

The display area DA may be an area including a plurality of pixels to display an image. The plurality of pixels may be arranged in a matrix form. In an embodiment, the plurality of pixels may have a rectangular, rhombic, or square shape in a plan view, but not being limited thereto. In one alternative embodiment, for example, the plurality of pixels may have a quadrilateral shape other than a rectangular, rhombic, or square shape, a polygonal shape other than a quadrilateral shape, a circular shape, or an elliptical shape.

The non-display area NDA may be an area that does not include pixels and does not display an image. The non-display area NDA may be disposed around the display area DA. The non-display area NDA may be disposed to surround the display area DA as shown in FIGS. 1 and 2, but is not limited thereto. The display area DA may be partially surrounded by the non-display area NDA.

In an embodiment, the display device 10 may maintain in a folded state or an unfolded state. In an embodiment, as shown in FIG. 2, the display device 10 may be folded in an in-folding manner in which the display area DA is disposed on the inside thereof. When the display device 10 is folded in an in-folding manner, the top (or front) surfaces of the display device 10 may be disposed to face each other. In an embodiment, the display device 10 may be folded in an out-folding manner in which the display area DA is disposed on the outside thereof. When the display device 10 is folded in an out-folding manner, the bottom (or rear) surfaces of the display device 10 may be disposed to face each other.

In an embodiment, the display device 10 may be a foldable device. As used herein, the term "foldable device" refers to a device which can be folded and is used to mean not only a folded device but also a device that can have both a folded state and an unfolded state. Further, the folding may typically include folding at an angle of about 180 degrees. However, the disclosure is not limited thereto, and the folding angle may exceed 180 degrees or be less than 180 degrees, for example, a case where the folding angle is equal to or greater than 90 degrees and less than 180 degrees, or a case where the folding angle is equal to or greater than 120 degrees and less than 180 degrees. In addition, it may be referred to as a folded state if folding is performed out of the unfolded state, even if complete folding is not performed. For example, even if it is folded at an angle of 90 degrees or less, as long as the maximum folding angle becomes 90 degrees or more, it may be defined as being in a folded state to be distinguished from the unfolded state. During the folding, the radius of curvature may be about 5 millimeters (mm) or less, for example, in a range of about 1 mm to about 2 mm, or may be about 1.5 mm, but is not limited thereto.

In an embodiment, the display device 10 may include a folding area FDA, a first non-folding area NFA1, and a second non-folding area NFA2. The folding area FDA may be an area of the display device 10 which is folded when the display device 10 in a folded state, and the first and second non-folding areas NFA1 and NFA2 may be areas of the display device 10 which are not folded or flat when the display device 10 in the folded state.

The first non-folding area NFA1 may be disposed on one side (e.g., an upper side) of the folding area FDA. The second non-folding area NFA2 may be disposed on the other side (e.g., a lower side) of the folding area FDA. The folding area FDA may be an area bent with a predetermined curvature.

In an embodiment, the folding area FDA of the display device 10 may be determined or defined at a specific location. One or two or more folding areas FDA may be determined or defined at a specific location(s) in the display device 10. In an alternative embodiment, the location of the folding area FDA may not be specified in the display device 10 and may be freely set in various areas.

In an embodiment, the display device 10 may be folded in the second direction DR2. Accordingly, the length of the display device 10 in the second direction DR2 may be reduced to approximately half, so that a user may conveniently carry the display device 10.

In such an embodiment, the direction in which the display device 10 is folded is not limited to the second direction DR2. In one alternative embodiment, for example, the display device 10 may be folded in the first direction DR1. In such an embodiment, the width of the display device 10 in the first direction DR1 may be reduced to approximately half.

FIGS. 1 and 2 illustrate embodiments where each of the display area DA and the non-display area NDA overlaps the folding area FDA, the first non-folding area NFA1 and the second non-folding area NFA2, but the disclosure is not limited thereto. In one alternative embodiment, for example, each of the display area DA and the non-display area NDA may overlap at least one of the folding area FDA, the first non-folding area NFA1, and the second non-folding area NFA2.

Hereinafter, an embodiment of the display device will be described in detail with reference to FIGS. 3 to 7.

Figure 3:
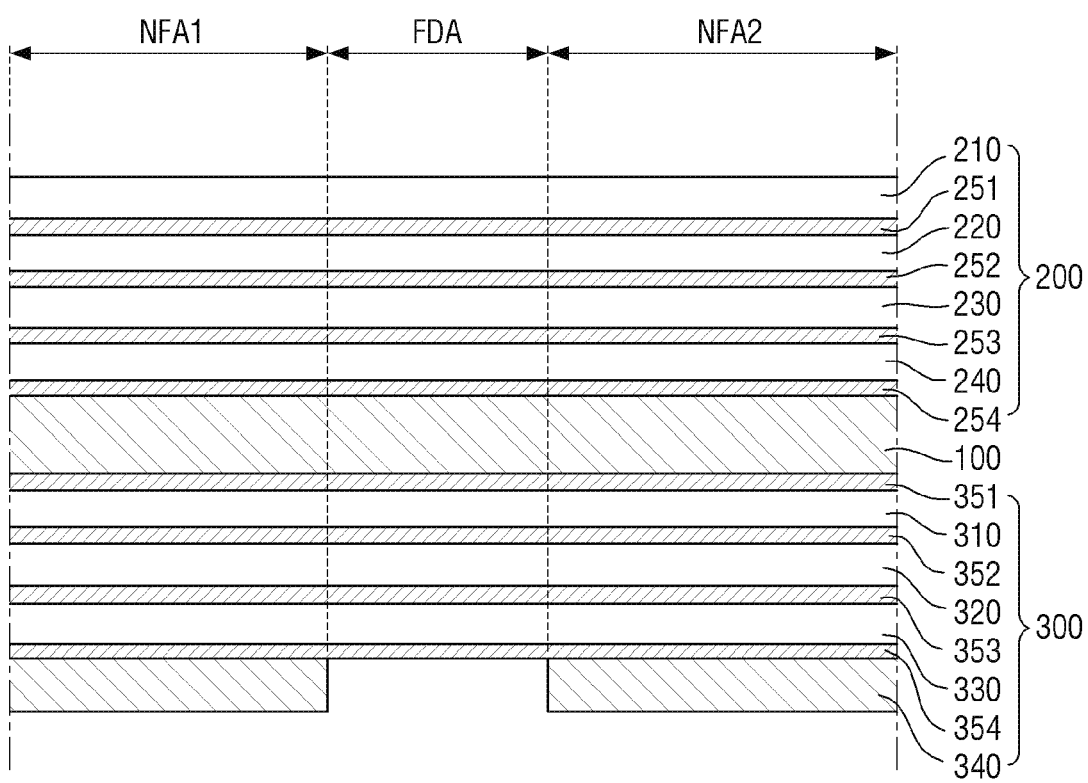
FIG. 3 is a cross-sectional view of a display device in an unfolded state according to an embodiment.
Figure 4:
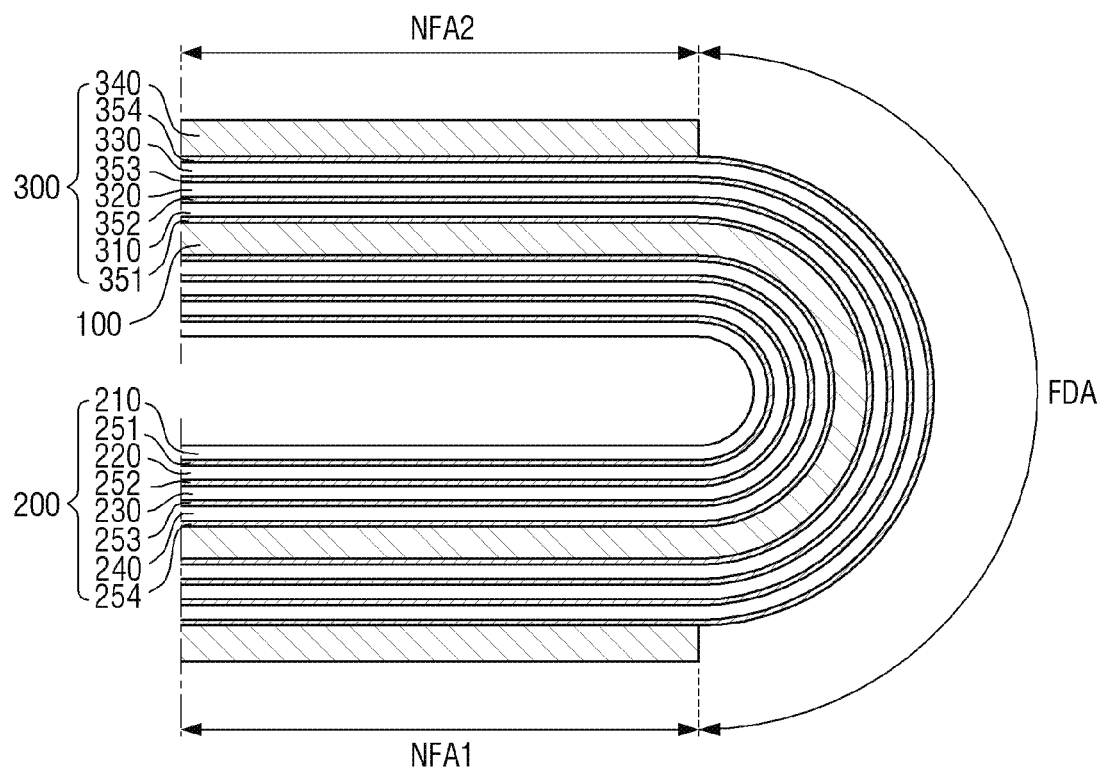
FIG. 4 is a cross-sectional view of a display device in a folded state according to an embodiment.

FIG. 3 is a cross-sectional view of a display device in an unfolded state according to an embodiment. FIG. 4 is a cross-sectional view of a display device in a folded state according to an embodiment.

Referring to FIGS. 3 and 4, an embodiment of the display device 10 may include a display panel 100, a front stacked structure 200 on the front side of the display panel 100, and a rear stacked structure 300 on the rear side of the display panel 100. Each of the stacked structures 200 and 300 may include at least one bonding member 251 to 254 or 351 to 354. Here, the front side of the display panel 100 refers to a side on which a screen of the display panel 100 is defined, and the rear side refers to the opposite side of the front side. One surface of the display panel 100 is located on the front side, and the other surface of the display panel 100 is located on the rear side.

The display panel 100 is a panel for displaying an image or defining a screen. In an embodiment, the display panel 100 may include a self-luminous display panel such as an organic light emitting display ("OLED") panel, an inorganic electroluminescence ("EL") display panel, a quantum dot ("QED") display panel, a micro-LED display panel, a nano-LED display panel, a plasma display panel ("PDP"), a field emission display ("FED") panel and a cathode ray tube ("CRT") display panel, and also include a light receiving display panel such as a liquid crystal display ("LCD") panel and an electrophoretic display ("EPD") panel. Hereinafter, for convenience of description, embodiments where the display panel 100 is an organic light emitting display panel will be described in detail, but not being limited thereto. Alternatively, the display panel 100 may be one of other types of display panel listed above or known in the art.

The display panel 100 may further include a touch sensor. In an embodiment, the touch sensor may be provided as a panel or may be provided as a film separate from the display panel 100 and attached onto the display panel 100, but may also be provided in the form of a touch layer inside the display panel 100. Hereinafter, an embodiment in which the touch sensor is provided inside the display panel 100 and included in the display panel 100 will be described in detail with reference to FIG. 5, but the disclosure is not limited thereto.

Figure 5:
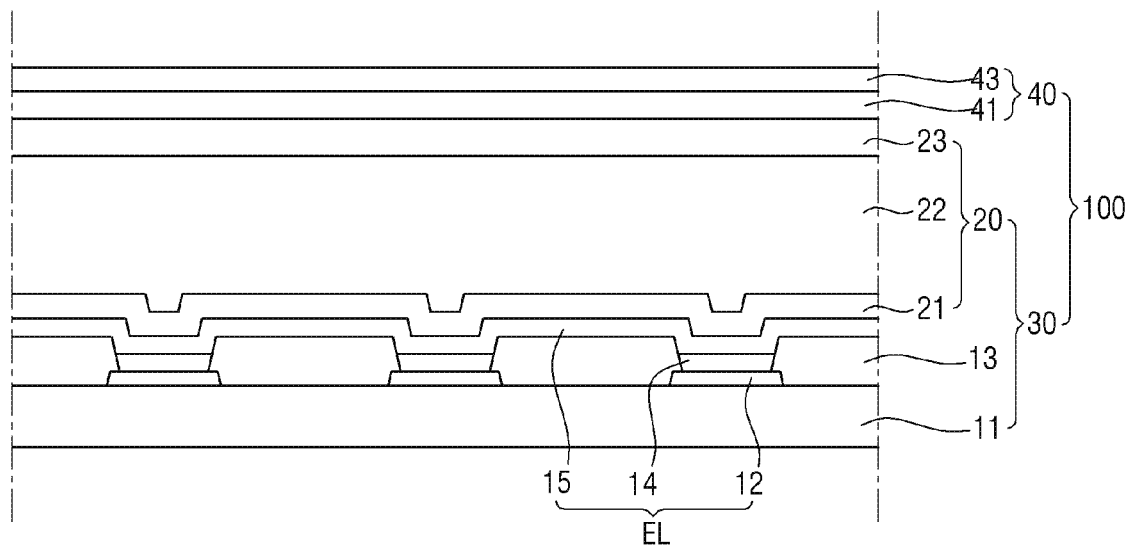
FIG. 5 is a cross-sectional view of a display panel according to an embodiment.

FIG. 5 is a cross-sectional view of a display panel according to an embodiment.

Referring to FIG. 5, an embodiment of the display device 10 may include the display panel 100. The display panel 100 may include a base substrate 11, a first electrode 12, a pixel defining layer 13, a light emitting layer 14, a second electrode 15, an encapsulation layer 20 and a touch sensor 40. In such an embodiment, the base substrate 11, the first electrode 12, the pixel defining layer 13, the light emitting layer 14, the second electrode 15 and the encapsulation layer 20 may collectively defined a display portion 30 (or layer) of the display panel 100, the touch sensor 40 may define a touch sensing portion (or layer) of the display panel 100.

The base substrate 11 may be an insulating substrate. The base substrate 11 may be flexible, and may include a polymer material having flexibility. In an embodiment, the polymer material may include polyimide ("PI"), polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polycarbonate ("PC"), cellulosetriacetate ("CAT"), cellulose acetate propionate ("CAP"), or a combination thereof.

The first electrode 12 may be disposed on the base substrate 11. In an embodiment, the first electrode 12 may be an anode electrode. Although not shown in the drawing, a plurality of components may be further disposed between the base substrate 11 and the first electrode 12. The plurality of configurations may include, for example, a buffer layer, a plurality of conductive wires, an insulating layer, and a plurality of thin film transistors.

The pixel defining layer 13 may be disposed on the first electrode 12. An opening may be defined or formed through the pixel defining layer 13 to expose at least a portion of the first electrode 12.

The light emitting layer 14 may be disposed on the first electrode 12. In an embodiment, the light emitting layer 14 may emit one of red light, green light, and blue light. The wavelength of red light may be in a range of about 620 nanometers (nm) to about 750 nm, and the wavelength of green light may be in a range of about 495 nm to about 570 nm. Further, the wavelength of blue light may be in a range of about 450 nm to about 495 nm. The light emitting layer 14 may be a single layer. Alternatively, the light emitting layer 14 may have a structure in which a plurality of organic light emitting layers are stacked one on another, for example, a tandem structure. In an alternative embodiment, the light emitting layer 14 may emit white light. In such an embodiment, where the light emitting layer 14 emits white light, the light emitting layer 14 may have a form or structure in which a red organic light emitting layer, a green organic light emitting layer, and a blue organic light emitting layer are stacked.

The second electrode 15 may be disposed on the light emitting layer 14 and the pixel defining layer 13. In an embodiment, the second electrode 15 may be commonly provided entirely on the light emitting layer 14 and the pixel defining layer 13. In an embodiment, the second electrode 15 may be a cathode electrode.

The first electrode 12, the second electrode 15, and the light emitting layer 14 may collectively defined or constitute a light emitting element EL.

The encapsulation layer 20 may be disposed on the light emitting element EL. The encapsulation layer 20 may seal the light emitting element EL and prevent moisture or the like from entering the light emitting element EL from the outside.

In an embodiment, the encapsulation layer 20 may be implemented as a thin film encapsulation, and may include one or more organic films and one or more inorganic films.

In one embodiment, for example, the encapsulation layer 20 may include a first inorganic film 21 disposed on the second electrode 15, an organic film 22 disposed on the first inorganic film 21, and a second inorganic film 23 disposed on the organic film 22.

The first inorganic film 21 may prevent moisture, oxygen or the like from infiltrating into the light emitting element EL. The first inorganic film 21 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or the like.

The organic film 22 may be disposed on the first inorganic film 21. The organic film 22 may improve flatness. The organic film 22 may include or be formed of a liquid organic material, for example, acrylic resin, methacrylic resin, polyisoprene, vinyl resin, epoxy resin, urethane resin, cellulose resin, perylene resin, or the like. The organic material may be provided or formed on the base substrate 11 through vapor deposition, printing and coating, and may be subjected to a curing process.

The second inorganic film 23 may be disposed on the organic film 22. The second inorganic film 23 may perform substantially the same or similar function to the first inorganic film 21, and may include or be formed of a material substantially the same or similar to the first inorganic film 21. The second inorganic film 23 may completely cover the organic film 22. In an embodiment, the second inorganic film 23 and the first inorganic film 21 may contact each other in the non-display area NDA to form an inorganic-inorganic junction. However, the structure of the encapsulation layer 20 is not limited thereto, and the stacked structure of the encapsulation layer 20 may be variously modified. In an alternative embodiment, the encapsulation layer 20 may include or be formed of a glass substrate or the like.

The touch sensor 40 may be disposed on the encapsulation layer 20. In an embodiment, the touch sensor 40 may be disposed directly on the encapsulation layer 20. In such an embodiment, the encapsulation layer 20 may function as a base portion of the touch sensor 40.

The touch sensor 40 may include a touch element layer 41 and a protective layer 43. The touch element layer 41 may include a touch electrode and touch signal lines connected to the touch electrode. In an embodiment, the touch electrode may include a metal, and may have a mesh shape. In such an embodiment, the touch electrode may include or be formed of a metal mesh pattern, thereby improving flexibility of the touch element layer 41.

The protective layer 43 may be disposed on the touch element layer 41 to protect the touch element layer 41. In an embodiment, the protective layer 43 may include an organic material, and may include or be formed of, for example, an acrylic polymer. In an embodiment where the protective layer 43 includes or is formed of an organic material, flexibility of the touch sensor 40 may be improved.

Referring back to FIGS. 3 and 4, the front stacked structure 200 may be disposed on the front side of the display panel 100. The front stacked structure 200 may include a polarization member 240, an impact absorbing layer 230, a cover window 220, and a cover window protective layer 210, which are sequentially stacked forward (upward or outward) from the display panel 100.

The polarization member 240 may polarize light passing therethrough. The polarization member 240 may serve to reduce the reflection of external light. In an embodiment, the polarization member 240 may be a polarizing film. The polarizing film may include a polarizing layer and protective substrates interposing the polarizing layer therebetween. The polarizing layer may include a polyvinyl alcohol film. The polarizing layer may be stretched in a predetermined direction. The stretching direction of the polarizing layer may be an absorption axis, and a direction perpendicular thereto may be a transmission axis. The protective substrates may be disposed on one surface and the other surface of the polarizing layer, respectively. The protective substrate may include or be formed of cellulose resin such as triacetyl cellulose, polyester resin, or the like, but is not limited thereto.

The impact absorbing layer 230 may be disposed on the front side of the polarization member 240. The impact absorbing layer 230 may serve to protect a structure such as a lower display panel from external impact. In one embodiment, the impact absorbing layer 230 may be a polymer film. The polymer film include, for example, at least one of PET, PEN, polyether sulfone ("PES"), PI, PAR, PC, polymethyl methacrylate ("PMMA"), or cycloolefin copolymer ("COC").

The cover window 220 may be disposed on the front side of the impact absorbing layer 230. The cover window 220 serves to protect the display panel 100. The cover window 220 may include or be formed of a transparent material. The cover window 220 may include, for example, a glass material or a plastic.

In an embodiment where the cover window 220 includes a glass, the glass may be ultra-thin glass (also referred to as UTG) or thin glass. In an embodiment where the glass is ultra-thin glass or thin glass, the glass may have a flexible property such that the glass can be bent, folded, or rolled. The thickness of the glass may be, for example, in a range of about 10 micrometers ($\mu$m) to about 300 $\mu$m, particularly, about 10 $\mu$m to about 100 $\mu$m, or about 50 $\mu$m. The glass of the cover window 220 may include soda-lime glass, alkali aluminosilicate glass, borosilicate glass, or lithium alumina silicate glass. The glass of the cover window 220 may include chemically strengthened or thermally strengthened glass to have strong rigidity. Chemical strengthening may be achieved through an ion exchange process in alkaline salts. The ion exchange process may be performed two or more times.

In addition, the cover window 220 may be obtained by coating glass thin films on opposing surfaces of the polymer film.

Figure 6:
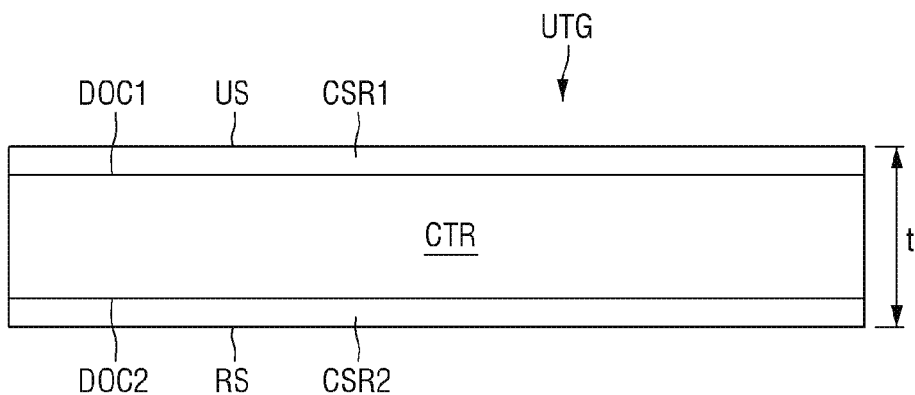
FIG. 6 is a cross-sectional view of ultra-thin glass according to an embodiment.
Figure 7:
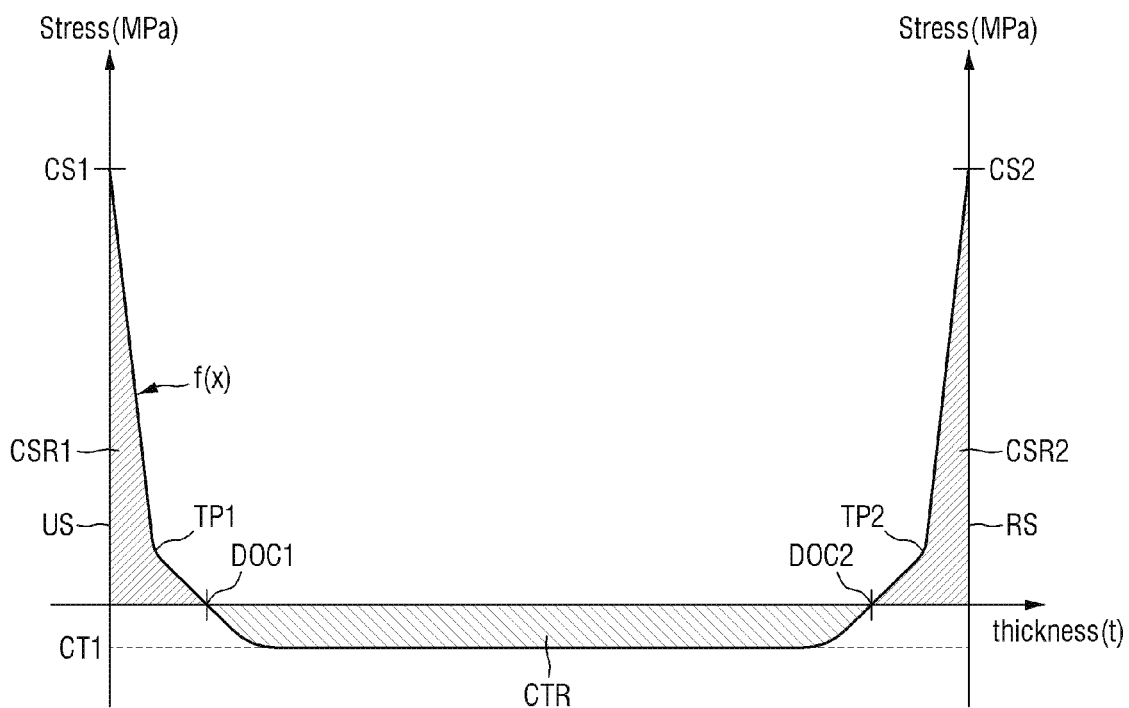
FIG. 7 is a graph showing a stress profile of ultra-thin glass according to an embodiment.

Hereinafter, an embodiment of the cover window 220 including or formed of ultra-thin glass UTG will be described in detail with reference to FIGS. 6 and 7. FIG. 6 is a cross-sectional view of ultra-thin glass according to an embodiment. FIG. 7 is a graph showing a stress profile of ultra-thin glass according to an embodiment.

Referring to FIG. 6, an embodiment of an ultra-thin glass UTG may include a first surface US, a second surface RS, and a side surface. In the ultra-thin glass UTG having a flat plate shape, the first surface US and the second surface RS may be defined as main surfaces having a large area, and the side surface may be defined as an outer surface connecting the first surface US with the second surface RS.

A thickness t of the ultra-thin glass UTG is defined as a distance between the first surface US and the second surface RS. The thickness t of the ultra-thin glass UTG may be in a range of about 10 $\mu$m to about 300 $\mu$m, for example, in a range of about 10 $\mu$m to about 100 $\mu$m, or in a range of about 10 $\mu$m to about 30 $\mu$m.

The ultra-thin glass UTG may be strengthened to have a predetermined stress profile therein. The strengthened ultra-thin glass UTG more efficiently prevents generation of cracks, propagation of cracks, breakage and the like due to external impact than before strengthening. The ultra-thin glass UTG strengthened by a strengthening process may have a different stress for each region.

Referring to FIG. 7, an X-axis in the graph of FIG. 7 represents the thickness direction of the ultra-thin glass UTG. In FIG. 7, the compressive stress has positive values, while the tensile stress has negative values. Herein, the magnitude of the compressive/tensile stress means the magnitude of an absolute value regardless of its sign.

Referring to FIG. 7, the ultra-thin glass UTG includes a first compressive region CSR1 extending (or expanding) from the first surface US to a first compression depth DOC1, and a second compressive region CSR2 extending (or expanding) from the second surface RS to a second compression depth DOC2. The tensile region CTR is disposed between the first compression depth DOC1 and the second compression depth DOC2. The overall stress profile in the ultra-thin glass UTG may be symmetrical between both regions of the first and second surfaces US and RS with respect to the center of the direction of the thickness t.

The first compressive region CSR1 and the second compressive region CSR2 are resistant to external impact to prevent the occurrence of cracks or breakage of the ultra-thin glass UTG. As maximum compressive stresses CS1 and CS2 of the first compressive region CSR1 and the second compressive region CSR2 are larger, the strength of the ultra-thin glass UTG generally increases. Since external impact is usually transmitted through the surface of the ultra-thin glass UTG, it is desired to have the maximum compressive stresses CS1 and CS2 at the surface of the ultra-thin glass UTG in terms of durability. Accordingly, in such an embodiment, the compressive stress of the first compressive region CSR1 and the second compressive region CSR2 tends to be the largest at the surface and generally decrease toward the inside.

The first compression depth DOC1 and the second compression depth DOC2 suppress cracks or grooves formed in the first surface US and the second surface RS from propagating to the tensile region CTR inside the ultra-thin glass UTG. As the first compression depth DOC1 and the second compression depth DOC2 are larger, t propagation of cracks and the like may be more effectively prevented. The point corresponding to the first compression depth DOC1 and the second compression depth DOC2 corresponds to a boundary between the compressive regions CSR1 and CSR2 and the tension region CTR, and has a stress value of zero.

Throughout the ultra-thin glass UTG, the tensile stress of the tensile region CTR may be balanced with the compressive stress of the compressive regions CSR1 and CSR2. That is, the total compressive stress (i.e., the compressive energy) in the ultra-thin glass UTG may be the same as the total tensile stress (i.e., the tensile energy) in the ultra-thin glass UTG.

The maximum tensile stress CT1 of the ultra-thin glass UTG may be generally located at a central portion in the thickness t direction of the ultra-thin glass UTG. In such an embodiment, it is desired that the compressive stress and the compression depths DOC1 and DOC2 have large values to increase the strength of the ultra-thin glass UTG. However, as the compressive energy increases, the tensile energy also increases, and the maximum tensile stress CT1 may increase. Accordingly, it is desirable to adjust the stress profile such that the maximum compressive stresses CS1 and CS2 and the compression depths DOL1 and DOL2 have large values while the compressive energy becomes smaller to meet the fragility requirements while having a high strength. In an embodiment, each of the first compressive region CSR1 and the second compressive region CSR2 may include a first transition point TP1 and a second transition point TP2 at which the slope of the stress profile changes abruptly. The shape of the stress profile (particularly, the shape of the stress profile in the compressive region) may be precisely controlled by adjusting the process conditions of the primary ion exchange process and the secondary ion exchange process.

Referring again to FIGS. 3 and 4, in an embodiment where the cover window 220 includes a plastic, a flexible property for folding may be improved. In such an embodiment, the cover window 220 may include, but are not limited to, at least one plastic material selected from polyimide, polyacrylate, PMMA, PC, PEN, polyvinylidene chloride, polyvinylidene difluoride ("PVDF"), polystyrene, ethylene vinylalcohol copolymer, polyethersulphone (PES), PEI, PPS, PAR, triacetyl cellulose ("TAC"), and CAP. The cover window 220 including a plastic may be formed to include one or more of the plastic materials listed above.

The cover window protective layer 210 may be disposed on the front side of the cover window 220. The cover window protective layer 210 may perform at least one of functions of prevention of scattering, impact absorption, prevention of scratch, prevention of fingerprint smudges and prevention of glare on the cover window 220. The cover window protective layer 210 may be formed to include a transparent polymer film. The transparent polymer film includes at least one selected from PET, PEN, PES, PI, PAR, PC, PMMA, and COC.

The front stacked structure 200 may include front bonding members (or layers) 251 to 254 for bonding adjacent stacked members. In one embodiment, for example, a first bonding member 251 may be disposed between the cover window 220 and the cover window protective layer 210 to couple (or bond) the cover window 220 and the cover window protective layer 210 to each other, a second bonding member 252 may be disposed between the cover window 220 and the impact absorbing layer 230 to couple the cover window 220 and the impact absorbing layer 230 to each other, a third bonding member 253 may be disposed between the impact absorbing layer 230 and the polarization member 240 to couple the impact absorbing layer 230 and the polarization member 240 to each other, and a fourth bonding member 254 may be disposed between the polarization member 240 and the display panel 100 to couple the polarization member 240 and the display panel 100 to each other. In the front bonding members 251 to 254 which are members for attaching the layers on one surface of the display panel 100, the first bonding member 251 may be a protective layer bonding member for attaching the cover window protective layer 210, the second bonding member 252 may be a window bonding member for attaching the cover window 220, the third bonding member 253 may be an impact absorbing layer bonding member for attaching the impact absorbing layer 230, and the fourth bonding member 254 may be a polarization member bonding member for attaching the polarization member 240. The front bonding members 251 to 254 may all be optically transparent.

The rear stacked structure 300 is disposed on the rear side of the display panel 100. The rear stacked structure 300 may include a polymer film layer 310, a cushion layer 320, and a plate 330, and a heat dissipation member 340, which are sequentially stacked rearward from the display panel 100.

The polymer film layer 310 may include a polymer film. The polymer film layer 310 may include, for example, PI, PET, PC, polyethylene ("PE"), polypropylene ("PP"), polysulfone ("PSF"), PMMA, TAC, cycloolefin polymer ("COP") or the like. The polymer film layer 310 may include a functional layer at a surface thereof. The functional layer may include, for example, a light absorbing layer. The light absorbing layer may include a light absorbing material such as a black pigment or dye. The light absorbing layer may be formed by coating or printing black ink on a polymer film.

The cushion layer 320 may be disposed on the rear side of the polymer film layer 310. The cushion layer 320 may absorb external impact and prevent the display panel 100 from being damaged. The cushion layer 320 may be formed of or defined by a single layer or a plurality of stacked layers. The cushion layer 320 may include, for example, a material having elasticity such as polyurethane or polyethylene resin. In an embodiment, the cushion layer 320 may include or be formed of a foam material similar to a sponge.

The plate 330 may be disposed on the rear side of the cushion layer 320. The plate 330 may be a support member for bonding the display device 10 to a case. The plate 330 may include or be formed of a material having rigidity. In an embodiment, the plate 330 may include or be formed of a metal or a metal alloy such as stainless steel ("SUS").

The heat dissipation member 340 may be disposed on the rear side of the plate 330. The heat dissipation member 340 serves to diffuse heat generated from the display panel 100 or other parts of the display device 10. The heat dissipation member 340 may include a metal plate. The metal plate may include a metal having high thermal conductivity, such as copper and silver. The heat dissipation member 340 may include a heat dissipation sheet including graphite or carbon nanotubes.

In an embodiment, the heat dissipation member 340 may be separated by the folding area FDA to facilitate folding of the display device 10 as illustrated in FIGS. 3 and 4, but not being limited thereto. In one embodiment, for example, a first metal plate may be disposed in the first non-folding area NFA1, and a second metal plate may be disposed in the second non-folding area NFA2. The first metal plate and the second metal plate may be physically separated from each other with respect to the folding area FDA.

The rear stacked structure 300 may include rear bonding members (or layers) 351 to 354 for bonding adjacent stacked members. In one embodiment, for example, a fifth bonding member 351 may be disposed between the display panel 100 and the polymer film layer 310 to couple the display panel 100 and the polymer film layer 310 to each other, a sixth bonding member 352 may be disposed between the polymer film layer 310 and the cushion layer 320 to couple the polymer film layer 310 and the cushion layer 320 to each other, a seventh bonding member 353 may be disposed between the cushion layer 320 and the plate 330 to couple the cushion layer 320 and the plate 330 to each other, and an eighth bonding member 354 may be disposed between the plate 330 and the heat dissipation member 340 to couple the plate 330 and the heat dissipation member 340 to each other. In the rear bonding members 351 to 354 which are members for attaching the layers on the other surface of the display panel 100, the fifth bonding member 351 may be a polymer film layer bonding member for attaching the polymer film layer 310, the sixth bonding member 352 may be a cushion layer bonding member for attaching the cushion layer 320, the seventh bonding member 353 may be a plate bonding member for attaching the plate 330, and the eighth bonding member 354 may be a heat dissipation member bonding member for attaching the heat dissipation member 340. In an embodiment, where the heat dissipation member 340 is separated with respect to the folding area FDA, the eighth bonding member 354 may also be separated in a same way, but may be continuously provided on an entire lower surface on the plate 330 as illustrated in FIG. 3 without being separated for each of the non-folding areas NFA1 and NFA2.

In an embodiment, where the display device 10 performs display only on the front surface, the rear bonding members 351 to 354 may not be optically transparent, unlike the front bonding members 251 to 254.

Each of the front bonding members 251 to 254 and the rear bonding members 351 to 354 described above may include an adhesive material. Each of the bonding members may include a pressure sensitive adhesive layer. The bonding members may have a same composition as each other, or may have different compositions according to the positions thereof and targets to be bonded.

Some of the front bonding members 251 to 254 may also include an optically transparent adhesive layer or an optically transparent resin. In one embodiment, for example, the second bonding member 252 used for bonding the cover window 220 to the display panel 100 may include an optically transparent adhesive layer or an optically transparent resin. However, the disclosure is not limited thereto.

Each of the first to eighth bonding members 251 to 254 and 351 to 354 may have a thickness of about 300 μm or less. In one embodiment, for example, each of the bonding members 251 to 254 and 351 to 354 may have a thickness of about 200 μm or less, and at least some of the bonding members 251 to 254 and 351 to 354 may have a thickness of about 100 μm or less. In an embodiment, but the thickness of the bonding members 251 to 254 and 351 to 354 may be about 10 μm or more to secure a minimum adhesion, but not being limited thereto. In an embodiment, each of the first to eighth bonding members 251 to 254 and 351 to 354 may have a thickness in a range of about 25 μm to about 100 μm.

In such an embodiment where each of the first to eighth bonding members 251 to 254 and 351 to 354 has the thickness in the range of about 25 μm to about 100 μm, the occurrence of peeling between the components included in the display device may be effectively prevented when the display device is folded.

Each of the bonding members 251 to 254 and 351 to 354 may be formed of or defined by a single adhesive layer, or may be formed of or defined by a multilayer including a plurality of adhesive layers. In an embodiment, each of the bonding members 251 to 254 and 351 to 354 may include adhesive layers on two opposing surfaces of a base layer, respectively, similarly to a double-sided tape.

In an embodiment, the bonding members 251 to 254 and 351 to 354 may include a silicone-based adhesive. The silicone-based adhesive may include siloxane resin. In one embodiment, for example, the silicone-based adhesive may include a silicone gum containing a polyorganosiloxane compound. The silicone gum may include a cross-linkable functional group such as a vinyl group. The silicone-based adhesive may further include MQ silicone resin having a molecular structure of a three-dimensional network containing a monofunctional siloxane unit and a tetrafunctional siloxane unit. The silicone-based adhesive may further include an additive containing a borane compound or a borate compound.

In an embodiment, the bonding members 251 to 254 and 351 to 354 may include an acrylic adhesive. The acrylic adhesive may include an acrylic polymer. The acrylic polymer may be produced by polymerizing acrylic monomers which may be the main material of acrylic polymers. The acrylic monomer may include ethyl acrylate, n-butyl acrylate, t-butyl acrylate, isobutyl acrylate, n-hexyl acrylate, 2-ethylhexyl acrylate, n-octyl acrylate, isooctyl acrylate, n-nonyl acrylate, isononyl acrylate, n-decyl acrylate, isodecyl acrylate, n-dodecyl acrylate, n-tridecyl acrylate, n-tetradecyl acrylate, 2-(2-ethoxyethoxy)ethyl acrylate, 2-hydroxyethyl acrylate, 2-hydroxypropyl acrylate, 2-hydroxybutyl 3-hydroxypropyl acrylate, acrylate, 4-hydroxybutyl acrylate, 6-hydroxyhexyl acrylate, 8-hydroxyoctyl acrylate, 10-hydroxydecyl acrylate, 12-hydroxylauryl acrylate, [4-(hydroxymethyl)cyclohexyl] methyl acrylate, and/or the like. The acrylic adhesive may also include an azo initiator such as 2,2'-azobisisobutyronitrile, a filler such as silica or zirconia, a crosslinking agent, an anti-static agent such as PEDOT:PSS (poly ethylenedioxythiophene:polystyrene sulfonate) or the like, in addition to the acrylic polymer. In one embodiment, for example, the acrylic adhesive may be fabricated by mixing 120 to 250 parts by weight of the acrylic monomer with a solvent and stirring the mixture while heating, and adding 0.1 to 1 part by weight of an azo initiator, 0.5 to 1 part by weight of a filler, 1.5 to 2.5 parts by weight of a crosslinking agent, and 0.5 to 1 part by weight of an anti-static agent into the solution and stirring the solution while heating.

In an alternative embodiment, the bonding members 251 to 254 and 351 to 354 may include a crystalline polymer and a rubber-based polymer. The crystalline polymer may be polypropylene, syndiotatic polystyrene, polyamide, polycaprolactone, polycarbonate-diol, PET, polyphenylene sulfide, polybutylene terephthalate ("PBT"), PAR, poly (DPAA), PEI, polyacetal, and/or polyoxymethylene ("POM").

The rubber-based polymer may be polybutadiene, polyisoprene, polyneoprene, polyisobutylene, cellulose acetate, polyvinyl acetate, a copolymer thereof, or the like. The weight ratio of the crystalline polymer and the rubber-based polymer may be equal to or greater than 1:1.5 and equal to or less than 1:0.3. The bonding member may further include a carbamic acid ester-based polymer, an ester-based polymer, and/or a (meth) acrylic acid ester-based polymer. The bonding member may further include a coupling agent such as a silane-based coupling agent, a titanate-based coupling agent, or a chromium-based coupling agent, an adhesion promoter such as rosin resin, rosin ester resin, terpene phenolic resin or terpene resin, a yellowing inhibitor, antioxidant, or the like.

In an embodiment, at least one of the bonding members 251 to 254 and 351 to 354 may include a silane coupling agent. In one embodiment, for example, the second bonding member 252, which is a window boding member, among the bonding members may include a silane coupling agent. In such an embodiment, where the second bonding member 252 is used for bonding the cover window 220, and the cover window 220 includes ultra-thin glass UTG, adhesive properties between the second bonding member 252 including or formed of an organic material and the cover window 220 including or formed of an inorganic material may be deteriorated. In one embodiment, for example, peeling may easily occur between the second bonding member 252 and the cover window 220 of the ultra-thin glass UTG under high temperature and high humidity conditions. In one embodiment, for example, the silane coupling agent included in the second bonding member 252 may increase adhesion between the second bonding member 252 and the cover window 220 of the ultra-thin glass.

In an embodiment, the silane coupling agent may be included in the bonding member, for example, a pressure sensitive adhesive ("PSA"), to increase adhesion to the cover window, for example, the ultra-thin glass UTG. Referring to the following reaction formula, in the silane coupling agent of the bonding member, an alkoxysilyl group (Si—OR') is hydrolyzed by water or moisture to become a silanol group (Si—OH). The silanol group and the glass surface form Si—O-glass bonds by a condensation reaction.

[Reaction Formula]

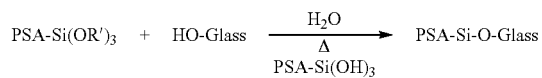

Accordingly, the silane coupling agent may be bonded by chemical bonding between the second bonding member 252 and the cover window 220, thereby improving the bonding force between the second bonding member 252 and the cover window 220.

The silane coupling agent is an organosilicon compound containing at least one reactive functional group and at least one alkoxy group in the structure. In one embodiment, for example, the silane coupling agent may include a methacrylate group, an acrylic group, or an epoxy group as the reactive functional group. As shown in Experimental Example 1 which will be described later, the silane coupling agent may include an epoxy group with little variation in physical properties under the high temperature and high humidity conditions.

The silane coupling agent may include, for example, an epoxy group-containing silane coupling agent such as 3-glycidoxypropyltrimethoxysilane, 3-glycidoxypropyltriethoxysilane, 3-glycidoxypropylmethyldiethoxysilane, 2-(3,4-epoxycyclohexyl)ethyltrimethoxysilane or the like, and an acryl group or methacrylate group-containing silane coupling agent such as 3-acryloxypropyltrimethoxysilane, 3-methacryloxypropyl triethoxysilane or the like.

The silane coupling agent may be used alone or in mixture of two or more kinds of silane coupling agents, and a total content of the silane coupling agent(s) may be 1 part by weight or less with respect to 100 parts by weight of adhesive resin of the bonding member. In an embodiment, the content of the silane coupling agent may be in a range of about 0.1 part by weight to about 1 part by weight. In one embodiment, for example, the content of the silane coupling agent may be in a range of about 0.2 part by weight to about 0.8 part by weight. As shown in Experimental Example 1 which will be described later, the content of the silane coupling agent may preferably be about 0.2 parts by weight, which is the minimum content among the contents exhibiting a same level of a peeling force. However, the content of the silane coupling agent is not limited thereto, and the silane coupling agent may have a smaller content within the limit of about 1 part by weight.

The constituent materials and compositions of the bonding members 251 to 254 and 351 to 354 are not limited to those exemplified above, and other configurations or compositions of adhesive materials known in the art may be applied thereto.

The front bonding members 251 to 254 and the rear bonding members 351 to 354 may have adhesive properties such as a predetermined elastic modulus, a creep property, a peeling force and the like. The elastic modulus and the creep property among the adhesive properties are related to deformation or restoration to the pressure applied to the adhesive layer, and the peeling force is related to adhesion of the adhesive layer. The bonding members 251 to 254 and 351 to 354 may be desired to have different adhesive properties according to the positions thereof because materials to be bonded differ according to the positions.

In an embodiment, the second bonding member 252 which is the window bonding member may have an elastic modulus and a creep property.

The elastic modulus of the second bonding member 252 may be in a range of about 0.07 megapascal (Mpa) to about 0.3 MPa at a temperature of −20° C., and may be in a range of about 0.02 to about 0.06 MPa at a temperature of 60° C. As the elastic modulus is smaller, the deformation more easily occurs for a same stress. When the elastic modulus is in the range of about 0.07 MPA to about 0.3 MPa at −20° C. and in the range of about 0.02 to about 0.06 MPa at 60° C., the deformation may easily occur even at compressive stress. Therefore, even when the folding operations are repeated thousands or more times (for example, about 200,000 times), defective film removal due to the compressive stress may be effectively prevented. The second bonding member 252 is stressed when the display device is folded, but the display device may be easily folded with the second bonding member 252 having the elastic modulus in the ranges described above.

The elastic modulus of the second bonding member 252 may be an elastic modulus value measured from the second bonding member 252 in a state of a thin film having a thickness of about 800 μm. Further, the elastic modulus of the second bonding member 252 may be an elastic modulus value measured from the state of a bonding member. The elastic modulus of the adhesive layer of the thin film may be measured by using a rheometer such as Rheometer of TA Instruments. The rheometer widely used to measure the elastic modulus of an adhesive material may perform the measurement with respect to an adhesive layer having a thickness of about 800 μm. The elastic modulus may be measured after setting the thickness of the bulk adhesive layer to 800 μm or greater. In an embodiment, the elastic modulus may be measured by using a nano indenter. In the case of using the indenter, the elastic modulus may be measured from a thin film having a thickness of about 500 μm or smaller, and measured even from a thin film having a thickness of about 1 μm.

In an embodiment, the creep property of the second bonding member 252 may be in a range of about 10% to about 25% at 60° C. The creep property which is another adhesive property may substantially be proportional to viscosity. When the creep property is less than about 10%, the deformation may be incomplete in the folding operation, and when the creep property exceeds about 25%, the restoration force may be insufficient. In an embodiment, the creep properties of the front bonding members 251 to 254 and the rear bonding members 351 to 354 may substantially be the same as each other.

The creep property described above may also be measured by using the rheometer or indenter. The creep property value measured from the second bonding member 252 may be in the range of about 10% to about 25%. Here, the second bonding member 252 subjected to the creep property measurement may be in the state of a thin film or in the state separated from the display device 10 to which the second bonding member 252 has been applied.

In an embodiment, the peeling force value of the second bonding member 252 may be about 200 gram-force per inch (gf/inch) or greater. The peeling force may be a value obtained by a universal testing machine ("UTM") when peeling occurs at a peeling angle of 180° with a peeling rate of 300 millimeter per minute (mm/min).

In an embodiment, the peeling force of the second bonding member 252 which is the window bonding member may be greater than the peeling forces of the remaining first bonding member 251, and third to eighth bonding members 253, 254 and 351 to 354. In one embodiment, for example, the window bonding member of the second bonding member 252 may have a peeling force greater than those of the protective layer bonding member of the first bonding member 251, the impact absorbing layer bonding member of the third bonding member 253, the polarization member bonding member of the fourth bonding member 254, the polymer film bonding member of the fifth bonding member 351, the buffer layer bonding member of the sixth bonding member 352, the plate bonding member of the seventh bonding member 353, and the heat dissipation member bonding member of the eighth bonding member 354.

In an embodiment, the peeling force of the second bonding member 252 may be about 500 gf/inch or greater. The second bonding member 252 may be disposed between the cover window 220 and the impact absorbing layer 230. The cover window 220 may be formed of ultra-thin glass as described above which is different from other constituent materials, for example, organic materials of the cover window protective layer 210, the polarization member 240 and the like. The bonding members 251 to 254 and 351 to 354 may substantially have physical properties determined for effective adhesion between an organic material and an organic material or between an organic material and metal. However, the second bonding member 252 may have a physical property of the peeling force to increase adhesion to the cover window 220, between the organic material of the impact absorbing layer 230 and the glass of the cover window 220. Therefore, as described above, in an embodiment, the second bonding member 252 further includes the silane coupling agent, thereby further improving the peeling force to the cover window 220.

In an embodiment, the second bonding member 252 which is the window bonding member may have a glass transition temperature (Tg) of about −30° C. or less. When the glass transition temperature is relatively high, the elastic modulus may increase, so that the second bonding member 252 may behave like a solid. However, when the glass transition temperature is relatively low, the elastic modulus may decrease, so that the second bonding member 252 may behave more flexibly. In an embodiment where the display device a is desired to be easily folded at a low temperature, the glass transition temperature (Tg) of the second bonding member 252 may be about −30° C. or smaller. In an embodiment, the glass transition temperature (Tg) of the first bonding member 251 and the third to eighth bonding members 253, 254 and 351 to 354 other than the second bonding member 252 may also be equal to or smaller than about −30° C.

Figure 8:
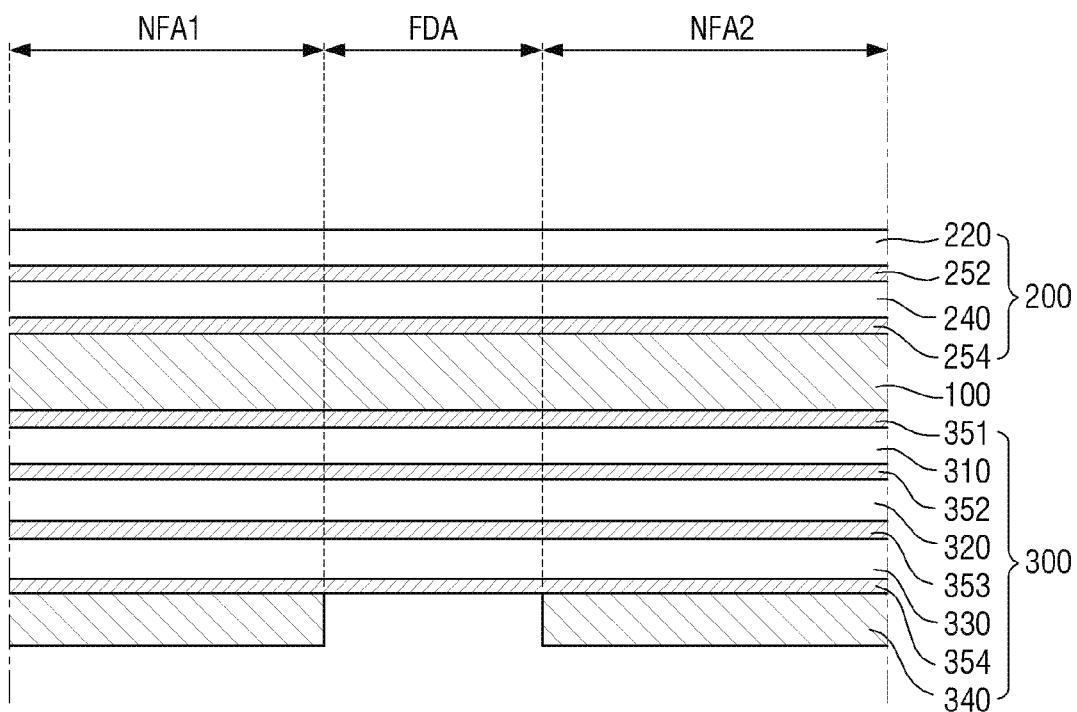
FIG. 8 is a cross-sectional view of a display device according to an alternative embodiment.
Figure 9:
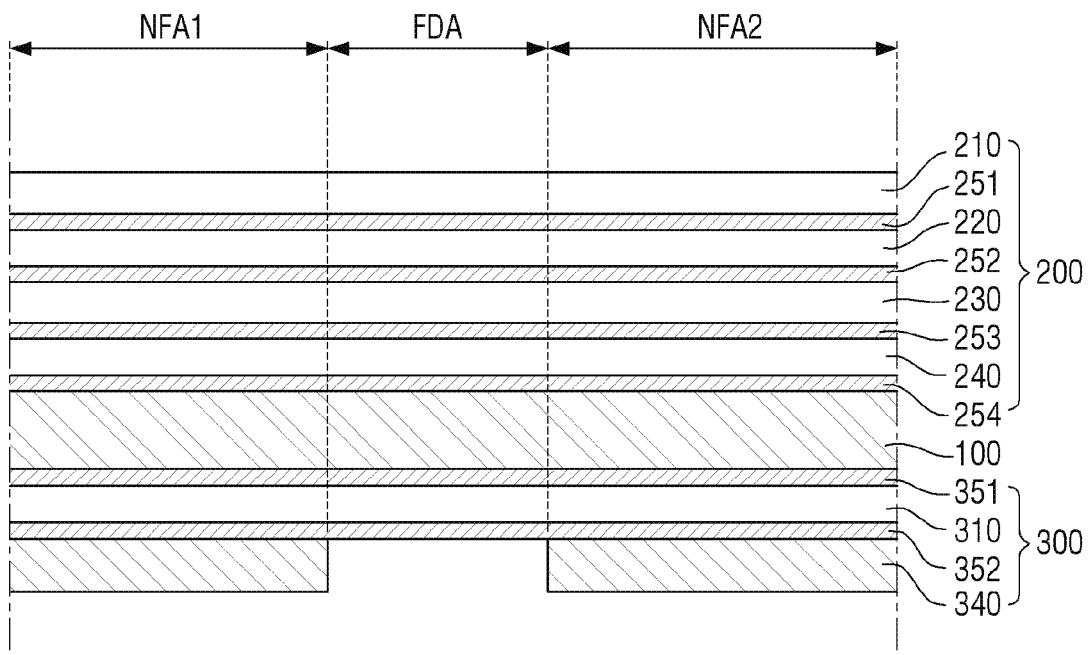
FIG. 9 is a cross-sectional view of a display device according to another alternative embodiment.

Hereinafter, an alternative embodiment will be described. FIGS. 8 and 9 illustrate embodiments of the display device having modified stacked structures.

Figure 10:
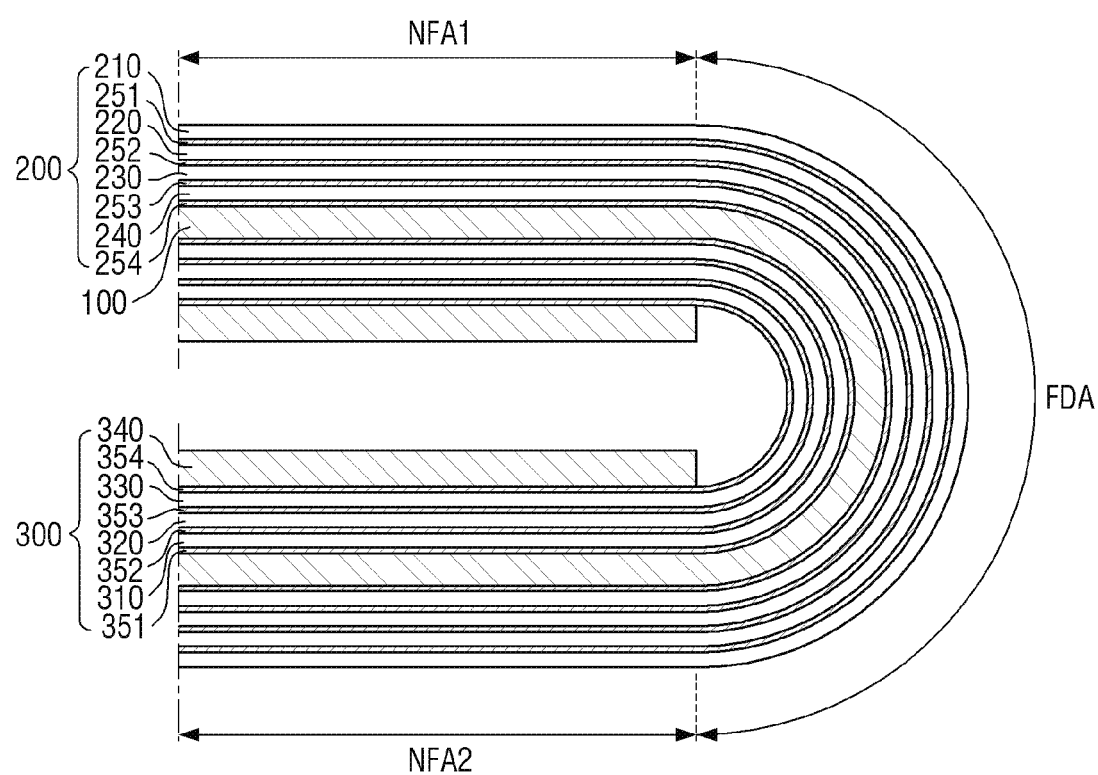
FIG. 10 is a cross-sectional view of a display device according to still another alternative embodiment.

FIG. 8 is a cross-sectional view of a display device according to an alternative embodiment. FIG. 9 is a cross-sectional view of a display device according to another alternative embodiment. FIG. 10 is a cross-sectional view of a display device according to still another alternative embodiment.

An alternative embodiment of the display device 10 shown in FIG. 8 is substantially the same as the embodiment described above with reference to FIG. 3 except that the cover window protective layer 210, the first bonding member 251, the impact absorbing layer 230, and the third bonding member 253 are omitted. In such an embodiment, the peeling force of the second bonding member 252 may be greater than those of the remaining fourth to eighth bonding members 254 and 351 to 354.

Another alternative embodiment of the display device 10 shown in FIG. 9 is substantially the same as the embodiment described above with reference to FIG. 3 except that the cushion layer 320, the seventh bonding member 353, the plate 330, and the eighth bonding member 354 are omitted. In FIGS. 8 and 9, the same or like elements have been labeled with the same reference characters as used above to describe the embodiments of the display device shown in FIG. 3, and any repetitive detailed description thereof will hereinafter be omitted.

An embodiment of the display device 10 shown in FIG. 10 is substantially the same as the embodiment of FIG. 3 in the stacked structure, but is different from the embodiment of FIG. 3 in that the folding operation is performed in an out-folding manner in which the display surface faces outward.

In an embodiment, as described above, when the display device 10 is folded in the out-folding manner, the front stacked structure 200 and the rear stacked structure 300 are stressed oppositely to those shown in FIG. 3. In such an embodiment, the front stacked structure 200 may be subjected to tensile stress, and the rear stacked structure 300 may be subjected to compressive stress. However, as described above, since the elastic modulus, the creep property, and the peeling force of the bonding members 251 to 254 and 351 to 354 are in in the above-described ranges of the physical properties, the display device may easily or effectively be out-folded.

Hereinafter, embodiments will be described in greater detail through fabrication examples and experimental examples.

Fabrication Example 1: Fabrication of Display Devices

A plurality of display device samples having the stacked structure shown in FIG. 3 were fabricated.

Fabrication Example 2: Preparation of Adhesive Samples

A pressure sensitive adhesive without a silane coupling agent was prepared as Adhesive #1; a pressure sensitive adhesive, which contains 0.2 parts by weight of a silane coupling agent having a methacrylate-reactive functional group, was prepared as Adhesive #2; a pressure sensitive adhesive, which contains 0.2 parts by weight of a silane coupling agent having an acrylate-reactive functional group, was prepared as Adhesive #3; a pressure sensitive adhesive, which contains 0.2 parts by weight of a silane coupling agent having an epoxy series reactive functional group, was prepared as Adhesive #4; a pressure sensitive adhesive, which contains 0.4 parts by weight of a silane coupling agent having an epoxy series reactive functional group, was prepared as Adhesive #5; and a pressure sensitive adhesive, which contains 0.6 parts by weight of a silane coupling agent having an epoxy series reactive functional group, was prepared as Adhesive #6.

Experimental Example 1: Measurement of the Elastic Modulus, Creep Property and Peeling Force Adhesives #2, #3, and #4 were respectively put and stored in chambers for 240 hours under a first condition of a temperature of 60° C. and humidity of 93%, a second condition of a temperature of −40° C., a third condition of a temperature of 70° C., and a fourth condition of room temperature. Thereafter, the samples were attached to ultra-thin glass UTG substrates by using a 2 kg roller, and then aged for 30 minutes. Then, with respect to each sample, the elastic modulus was measured at temperatures of −20° C. and 60° C., the creep property was measured at a temperature of 60° C., and the peeling force was measured at room temperature. Herein, the peeling force was indicated by an ultra-thin glass peeling force because the samples had been attached to the ultra-thin glass.

In the measurement of the elastic modulus and creep property, each adhesive sample was cut to have a size of 2 centimeters (cm)×2 cm and a thickness of 800 μm, and then the elastic modulus and creep property were measured by using the rheometer DHR-G2 of TA Instruments. Here, measurement conditions of the elastic modulus may be adjusted through a cooling step and a heating step. The cooling step is a step at which the temperature decreases from −25° C. to −45° C. at a rate of 10° C./min, and the heating step is a step at which the temperature increases from −45° C. to 100° C. at a rate of 5° C./min. After the cooling and heating steps, the final data was collected. In addition, the measurement conditions of the creep property may be adjusted through a cooling step, a creep step, and a recovery step. The cooling step is a step of maintaining at a temperature of 60° C. for 60 seconds, and the creep step is a step of applying a pressure of 2000 Pa for 600 seconds at the temperature of 60° C. The recovery step is a step at which a pressure of 0 Pa is applied for 600 seconds at the temperature of 60° C. At each of the creep step and the recovery step, strain was collected as data at 591 seconds. Further, the peeling force was measured at a peeling angle of 180° with a peeling rate of 300 mm/min by using the UTM. The results are shown in Table 1 below.

TABLE 1

| Samples | Items | Measurement temperature | Storage conditions | | | |
|---|---|---|---|---|---|---|
| | | | First condition | Second condition | Third condition | Fourth condition |
| Adhesive #2 | Elastic modulus (MPa) | −20° C. | 0.099 | 0.108 | 0.109 | 0.105 |
| | | 60° C. | 0.038 | 0.030 | 0.046 | 0.028 |
| | Creep property (%) | 60° C. | 6.6 | 15.5 | 5.3 | 16.3 |
| | Ultra-thin glass peeling force (gf/inch) | Room temperature | 142 ± 1 | 539 ± 25 | 84 ± 3 | 526 ± 31 |
| Adhesive #3 | Elastic modulus (MPa) | −20° C. | 0.120 | 0.111 | 0.118 | 0.113 |
| | | 60° C. | 0.040 | 0.027 | 0.044 | 0.027 |
| | Creep property (%) | 60° C. | 6.9 | 18.4 | 5.3 | 17.4 |
| | Ultra-thin glass peeling force (gf/inch) | Room temperature | 265 ± 28 | 591 ± 41 | 109 ± 14 | 620 ± 49 |
| Adhesive #4 | Elastic modulus (MPa) | −20° C. | 0.093 | 0.090 | 0.091 | 0.094 |
| | | 60° C. | 0.026 | 0.025 | 0.027 | 0.026 |
| | Creep property (%) | 60° C. | 18.2 | 18.9 | 14.7 | 18.4 |

TABLE 1-continued

| Samples | Items | Measurement temperature | Storage conditions | | | |
| --- | --- | --- | --- | --- | --- | --- |
| | | | First condition | Second condition | Third condition | Fourth condition |
| | Ultra-thin glass peeling force (gf/inch) | Room temperature | 482 ± 35 | 572 ± 63 | 448 ± 38 | — |

Referring to Table 1, Adhesive #2 and Adhesive #3 exhibited great variations in the elastic modulus, creep property, and peeling force under the high temperature and high humidity conditions of the first to third conditions. On the other hand, it was confirmed that Adhesive #4 did not significantly vary in the elastic modulus, creep property, and peeling force even under the high temperature and high humidity conditions of the first to third conditions. Consequently, it was confirmed that the sample of Adhesive #4 containing the epoxy series reactive functional group had higher reliability.

Experimental Example 2: Measurement of the Elastic Modulus, Creep Property, Glass Peeling Force and Ultra-Thin Glass Peeling Force by Contents of the Silane Coupling Agent Some samples of Adhesives #1, #4, #5, and #6 according to Fabrication Example 2 were kept under a first condition of room temperature, and the other samples were put and stored in a chamber under a second condition of a temperature of 70° C. for 10 days. Thereafter, the samples were attached to soda-lime glass substrates and ultra-thin glass (UTG) substrates by using the 2 kg roller, and then aged for 30 minutes. Then, with respect to each sample, the elastic modulus was measured at respective temperatures of −20° C., 25° C. and 60° C., the creep property was measured at a temperature of 60° C., the glass peeling force was measured at room temperature, and the ultra-thin glass peeling force was measured at room temperature after storing the sample for one day. At this time, the elastic modulus, creep property and peeling force were measured in the same manner as in Experimental Example 1. The results are shown in Table 2 below. Here, the peeling force measured after attaching the sample on the soda-lime glass substrate was indicated by the glass peeling force, and the peeling force measured after attaching the sample on the ultra-thin glass substrate was indicated by the ultra-thin glass peeling force.

TABLE 2

| Storage conditions | Items | Measurement conditions | Samples | | | |
| --- | --- | --- | --- | --- | --- | --- |
| | | | Adhesive #1 | Adhesive #4 | Adhesive #5 | Adhesive #6 |
| First condition | Elastic modulus (MPa) | −20° C. | 0.098 | 0.091 | 0.091 | 0.090 |
| | | 25° C. | 0.035 | 0.032 | 0.032 | 0.032 |
| | | 60° C. | 0.028 | 0.025 | 0.025 | 0.025 |
| | Creep property (%) | 60° C. | 14.8 | 19.6 | 20.28 | 21.3 |
| | Glass peeling force (gf/inch) | Room temperature | 533 ± 53 | 532 ± 49 | 483 ± 85 | 484 ± 28 |
| | Ultra-thin glass peeling force (gf/inch) | Room temperature | 446 ± 8 | 629 ± 4 | 656 ± 20 | 673 ± 9 |
| Second condition | Elastic modulus (MPa) | −20° C. | 0.091 | 0.095 | 0.087 | 0.091 |
| | | 25° C. | 0.033 | 0.035 | 0.032 | 0.033 |
| | | 60° C. | 0.027 | 0.029 | 0.027 | 0.028 |
| | Creep property (%) | 60° C. | 12.8 | 13 | 12.8 | 12.3 |
| | Glass peeling force (gf/inch) | Room temperature | 500 ± 100 | 327 ± 39 | 295 ± 30 | 289 ± 12 |
| | Ultra-thin glass peeling force (gf/inch) | Room temperature | 439 ± 7 | 465 ± 11 | 458 ± 15 | 463 ± 7 |

Referring to Table 2, the samples of Adhesive #4, #5, and #6 whose contents of the silane coupling agent differ as 0.2, 0.4, and 0.6 parts by weight were improved in the ultra-thin glass peeling forces under the first and second conditions compared to Adhesive #1 without the silane coupling agent. In addition, even if the content of the silane coupling agent increases, the physical property such as the ultra-thin glass peeling force is not significantly varied. Accordingly, it is desired to include 0.2 parts by weight of the silane coupling agent which is the minimum content of the silane coupling agent.

Experimental Example 3: Measurement of the Peeling Force

Each sample was attached to a first glass substrate, which is an ultra-thin glass substrate, and a second glass substrate, which is an ultra-thin glass substrate coated with silicon oxide, by using the 2 kg roller, and then aged for 30 minutes. Subsequently, the peeling force was measured at a peeling angle of 180° with a peeling rate of 300 mm/min by using the UTM. At this time, some samples were subjected to the peeling force measurement at a room temperature condition, the other samples were stored for 240 hours under conditions of high temperature of 60° C. and high humidity of 93%, and then subjected to the peeling force measurement. The results are shown in Table 3 below.

TABLE 3

| Conditions | Samples | First glass substrate Peeling force (gf/inch) | Second glass substrate Peeling force (gf/inch) |
|---|---|---|---|
| Room temperature | Adhesive #1 | 543 ± 10 | 1034 ± 60 |
| | Adhesive #2 | 503 ± 3 | 1544 ± 20 |
| | Adhesive #4 | 603 ± 60 | 1575 ± 34 |
| High temperature and high humidity | Adhesive #1 | 337 ± 30 | 882 ± 93 |
| | Adhesive #2 | 514 ± 43 | 1100 ± 13 |
| | Adhesive #4 | 547 ± 74 | 1019 ± 138 |

Referring to Table 3, each of Adhesives #1, #2, and #4 formed on the first glass substrates exhibited a peeling force of about 500 gf/inch or greater under the room temperature condition. However, Adhesive #1 exhibited a significantly decreased peeling force of about 337 gf/inch under the high temperature and high humidity conditions, whereas each of Adhesives #2 and #4 exhibited a peeling force of 500 gf/inch or greater without significant variation under the high temperature and high humidity conditions. In addition, each of Adhesives #1, #2, and #4 formed on the second glass substrates exhibited a peeling force of about 1,000 gf/inch or greater under the room temperature condition. However, Adhesive #1 exhibited a significantly decreased peeling force of about 882 gf/inch under the high temperature and high humidity conditions, whereas each of Adhesives #2 and #4 exhibited a peeling force of 1,000 gf/inch or greater without significant variation under the high temperature and high humidity conditions. That is, it was confirmed that the adhesive containing a silane coupling agent may effectively maintain the high peeling force to the ultra-thin glass under both the room temperature condition and high temperature and high humidity conditions.

Experimental Example 4: Evaluation of Folding Reliability

In-folding operations were repeatedly performed 200,000 times for 240 hours with respect to the display device samples according to Fabrication Example 1. As the display device samples, first samples, the cover window including or formed of ultra-thin glass, and second samples, the cover window including or formed of ultra-thin glass coated with a silicon oxide were prepared. Adhesive #1 was applied to some of the display device samples and Adhesive #4 was applied to the other display device samples. In addition, some of the display device samples were subjected to the in-folding operations under first conditions of a temperature of 60° C. and a humidity of 93%, and the other display device samples were subjected to the in-folding operations under second conditions of a variable temperature ranging from −10° C. to 65° C. and a humidity of 93%. Here, the variable temperature ranging from −10° C. to 65° C. was achieved by increasing the temperature from −10° C. to 65° C. and then decreasing the temperature to −10° C. again in one cycle, and repeating the cycles. The results are shown in Table 4 below.

TABLE 4

| Storage conditions | First sample | | Second sample | |
|---|---|---|---|---|
| | Adhesive #1 | Adhesive #4 | Adhesive #1 | Adhesive #4 |
| First condition | 44F/74 | 0F/30 | 13F/40 | 0F/10 |
| Second condition | 40F/59 | 0F/30 | 8F/55 | 0F/10 |

Referring to Table 4, among the first samples, 74 display device samples including Adhesive #1 were placed under the first conditions, and 59 display device samples including Adhesive #1 were placed under the second conditions. Among the 74 display device samples, 44 samples exhibited a film removal phenomenon between the ultra-thin glass and the adhesive. Meanwhile, among the 59 display device samples, 40 samples exhibited the film removal phenomenon. On the other hand, 30 display device samples including Adhesive #4 were placed under each of the first conditions and the second conditions, but the film removal phenomenon did not occur between the ultra-thin glass and the adhesive.

Further, among the second samples, 40 display device samples including Adhesive #1 were placed under the first conditions, and 55 display device samples including Adhesive #1 were placed under the second conditions. Among the 40 display device samples, 13 samples exhibited the film removal phenomenon between the ultra-thin glass and the adhesive. Meanwhile, among the 55 display device samples, 8 samples exhibited the film removal phenomenon. On the other hand, 10 display device samples including Adhesive #4 were placed under each of the first conditions and the second conditions, but the film removal phenomenon did not occur between the adhesive and the ultra-thin glass coated with a silicon oxide.

Accordingly, as shown in Table 4, even when the folding operations were performed 200,000 times under the high temperature and high humidity conditions, defective film removal did not occur between the adhesive and the ultra-thin glass of the display device, and a normal state was observed, that is, folding reliability is effectively maintained.

In embodiments of the invention, as described above, the bonding member including the silane coupling agent may be attached to the cover window which includes ultra-thin glass, such that the defective film removal at room temperature or at high temperature and high humidity may be effectively prevented, thereby improving reliability.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
a display panel; and
a front stacked structure on a front surface of the display panel;
wherein the front stacked structure includes a cover window and a bonding member, the bonding member includes a window bonding member attached to the cover window, the cover window includes ultra-thin glass having a thickness in a range of about 10 μm to about 300 μm, the ultra-thin glass includes a first compressive region extending from a first surface thereof to a first compression depth, a second compressive region extending from a second surface thereof to a second compression depth, and a tensile region disposed between the first compression region and the second compression region, a total compressive stress in the ultra-thin glass is the same as a total tensile stress in the ultra-thin glass, the window bonding member is attached to the ultra-thin glass, the window bonding member attached to the ultra-thin glass includes a silane compound containing an epoxy series reactive functional group, and wherein the silane compound includes any one of 3-glycidoxypropyltriethoxysilane, 3-glycidoxypropylmethyldiethoxysilane, and 2-(3,4-epoxycyclohexyl)ethyltrimethoxysilane, wherein the front stacked structure further includes a polarization member disposed between the display panel and the cover window and a polarization member bonding member which attaches the polarization member to the front surface of the display panel, a peeling force of the window bonding member is greater than a peeling force of the polarization member bonding member, the front stacked structure further includes an impact absorbing layer disposed between the polarization member and the cover window and an impact absorbing layer bonding member which attaches the impact absorbing layer to the polarization member, and a peeling force of the window bonding member is greater than a peeling force of the impact absorbing layer bonding member.

2. The display device of claim 1, wherein an elastic modulus of the window bonding member is in a range from about 0.07 MPa to about 0.3 MPa at a temperature of about −20° C., and is in a range from about 0.02 MPa to about 0.06 MPa at a temperature of about 60° C.

3. The display device of claim 2, wherein a creep property of the window bonding member is in a range from about 10% to about 25% at a temperature of about 60° C.

4. The display device of claim 3, wherein
the window bonding member is a thin film and has a thickness in a range of about 25 μm to about 100 μm, and
the elastic modulus and the creep property of the window bonding member are obtained by measurement in a state of the thin film.

5. The display device of claim 4, wherein the elastic modulus and the creep property of the window bonding member are obtained by measurement using a rheometer in the state of the thin film.

6. The display device of claim 1, wherein the window bonding member has a peeling force of about 500 gf/inch or more when peeling occurs at a peeling angle of about 180° with a peeling rate of about 300 mm/min in a state of being attached to the ultra-thin glass.

7. The display device of claim 1, wherein
the ultra-thin glass has a thickness in a range of about 10 μm to about 100 μm, and
the window bonding member has a peeling force of about 500 gf/inch or more when peeling occurs at a peeling angle of about 180° with a peeling rate of about 300 mm/min in a state of being attached to the ultra-thin glass.

8. The display device of claim 1, wherein a glass transition temperature (Tg) of the window bonding member is about −30° C. or less.

9. The display device of claim 1, wherein the window bonding member has a thickness in a range of about 25 μm to about 100 μm.

10. The display device of claim 1, wherein
the display device further comprising:
a rear stacked structure on a rear surface of the display panel,
wherein the rear stacked structure includes a polymer film layer disposed on the rear surface of the display panel, a cushion layer disposed on the polymer film layer, a plate disposed on the cushion layer, and a heat dissipation member disposed on the plate.

11. The display device of claim 10, wherein
the bonding member further includes other bonding members attached to the polymer film layer, the cushion layer, the plate, and the heat dissipation member, respectively, and
a peeling force of the window bonding member is greater than a peeling force of the other bonding members.

12. The display device of claim 1, wherein the display panel displays an image through a screen defined on the front surface thereof.

13. The display device of claim 1, wherein a content of the silane compound is about 0.2 parts by weight or less with respect to 100 parts by weight of the total composition of the window bonding member.

14. A display device comprising:
a display panel;
a front stacked structure on a front surface of the display panel, wherein the front stacked structure includes a cover window; and
a rear stacked structure on a rear surface of the display panel,
wherein each of the front stacked structure and the rear stacked structure includes a plurality of bonding members,
the front stacked structure includes a window bonding member attached to the cover window among the plurality of bonding members,
the cover window includes ultra-thin glass having a thickness in a range of about 10 μm to about 300 μm,
the ultra-thin glass includes a first compressive region extending from a first surface thereof to a first compression depth, a second compressive region extending from a second surface thereof to a second compression depth, and a tensile region disposed between the first compression region and the second compression region,
a total compressive stress in the ultra-thin glass is the same as a total tensile stress in the ultra-thin glass,
the window bonding member is attached to the ultra-thin glass,
the window bonding member attached to the ultra-thin glass includes a silane compound containing an epoxy series reactive functional group,
wherein the silane compound includes any one of 3-glycidoxypropyltriethoxysilane, 3-glycidoxypropylmethyldiethoxysilane, and 2-(3,4-epoxycyclohexyl)ethyltrimethoxysilane,
wherein the front stacked structure further includes a polarization member disposed between the display panel and the cover window and a polarization member bonding member which attaches the polarization member to the front surface of the display panel among the plurality of bonding members, a peeling force of the window bonding member is greater than a peeling force of the polarization member bonding member, the front stacked structure further includes an impact absorbing layer disposed between the polarization member and the cover window and an impact absorbing layer bonding member which attaches the impact absorbing layer to the polarization member among the plurality of bonding members, and a peeling force of the window bonding member is greater than a peeling force of the impact absorbing layer bonding member.

15. The display device of claim 14, wherein a content of the silane compound is about 0.2 parts by weight or less with respect to 100 parts by weight of the total composition of the window bonding member.

16. The display device of claim 14, wherein the window bonding member has a peeling force of about 500 gf/inch or more when peeling occurs at a peeling angle of about 180° with a peeling rate of about 300 mm/min in a state of being attached to the ultra-thin glass.

17. The display device of claim 14, wherein an elastic modulus of the window bonding member is in a range from about 0.07 MPa to about 0.3 MPa at a temperature of about −20° C., and is in a range from about 0.02 MPa to about 0.06 MPa at a temperature of about 60° C.

18. The display device of claim 14, wherein a creep property of the window bonding member is in a range from about 10% to about 25% at a temperature of about 60° C.

19. The display device of claim 14, wherein the rear stacked structure further includes a heat dissipation member disposed on the rear surface of the display panel, a plate disposed between the display panel and the heat dissipation member, a cushion layer disposed between the display panel and the plate, and a polymer film layer disposed between the display panel and the cushion layer, and the plurality of bonding members is attached to the polarization member, the impact absorbing layer, the heat dissipation member, the plate, the cushion layer, and the polymer film layer, respectively.

20. The display device of claim 14, wherein the display device is an in-foldable display device which is folded such that a display surface faces inward or an out-foldable display device which is folded such that the display surface faces outward.

* * * * *